United States Patent
Bonomi et al.

(10) Patent No.: US 11,405,027 B1
(45) Date of Patent: Aug. 2, 2022

(54) SYSTEM AND METHOD FOR MEASURING DELAYS OF DELAY ELEMENTS

(71) Applicant: Infineon Technologies AG, Neubiberg (DE)

(72) Inventors: Stefano Bonomi, Villach (AT); Nicolo Zilio, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 17/350,359

(22) Filed: Jun. 17, 2021

(51) Int. Cl.
*H03K 5/14* (2014.01)
*H03K 5/00* (2006.01)

(52) U.S. Cl.
CPC ..... *H03K 5/14* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 10,739,391 B2 * | 8/2020 | Jenkins | G01R 29/0273 |
| 11,031,927 B2 * | 6/2021 | Sheen | G04F 5/00 |

OTHER PUBLICATIONS

Akita, Horonobu et al., "A Novel Analog Mirror Type DLL suitable for Low Voltage Operation with Self-Calibration Method", Proceedings of Second IEEE Asia Pacific Conference on ASICs. AP-ASIC 2000 (Cat. No. 00EX434), Aug. 30, 2000, 2 pages.

Bae, Jong-Cheol et al., "A Mixed PLL/DLL Architecture for Low Jitter Clock Generation", IEEE International Symposium on Circuits and Systems (IEEE Cat. No. 04CH37512), May 23-26, 2004, 4 pages.

Cheewasrirungraung, Danaipon et al., "A Multi-Gigabit DLL-based CMOS PWM Demodulator Using Delay Vernier Sampler", ECTI-CON2010: The 2010 ECTI International Conference on Electrical Engineering/Electronics, Computer, Telecommunications and Information Technology, May 19-21, 2010, 5 pages.

Chen, Hsin-Shu et al., "A Self-Calibrated Multiphase DLL-Based Clock Generator", 2007 International Symposium on VLSI Design, Automation and Test (VLSI-DAT), Apr. 25-27, 2007, 4 pages.

Chen, Zong-Yi et al., "DLL-Based Pulse-Width Modulation Digital-to-Analog Converter for Continuous-Time Sigma Delta Modulators", IEEE 57th International Midwest Symposium on Circuits and Systems (MWSCAS), Texas, US, Aug. 3-6, 2014, 4 pages.

Chung, Daehyun "Chip-Package Hybrid Clock Distribution Network and DLL for Low Jitter Clock Delivery", IEEE Journal of Solid-State Circuits, vol. 41, No. 1, Jan. 2006, 13 pages.

Du, Qingjin et al., "A Low-Phase Noise, Anti-Harmonic Programmable DLL Frequency Multiplier With Period Error Compensation for Spur Reduction", IEEE Transactions on Circuits and Systems II: Express Briefs, vol. 53, No. 11, Nov. 2006, 5 pages.

(Continued)

*Primary Examiner* — Cassandra F Cox
(74) *Attorney, Agent, or Firm* — Slater Matsil, LLP

(57) ABSTRACT

In accordance with an embodiment a circuit includes: a plurality of delay elements coupled in series, each delay element including an input node and an output node; a multiplexer having inputs coupled to the output node of each delay element of the plurality of delay elements; and a time measurement circuit including a time amplifier having an input coupled to an output of the multiplexer, and a counter coupled to an output of the time amplifier.

22 Claims, 7 Drawing Sheets

(56) References Cited

OTHER PUBLICATIONS

Eto, Satoshi et al., "333MHz, 20mW, 18ps Resolution Digital DLL using current-controlled delay with parallel variable resistor DAC (PVR-DAC)", Fujitsu Limited, Proceedings of Second IEEE Asia Pacific Conference on ASICs. AP-ASIC 2000 (Cat. No. 00EX434), Aug. 28-30, 2000, 2 pages.
Hwang, Sung-Sik et al., "A DLL based 10—320MHz Clock Synchronizer", IEEE International Symposium on Circuits and Systems, May 28-31, 2000, Geneva, Switzerland, 4 pages.
Jeong, Chan-Young et al., "A Fast Automatic Frequency Calibration (AFC) Scheme for Phase-Locked Loop (PLL) Frequency Synthesizer", RTUIF-16, IEEE Radio Frequency Integrated Circuits Symposium, Jun. 7-9, 2009, 4 pages.
Kang, Jin-Ku et al., "A CMOS High-Speed Data Recovery Circuit Using the Matched Delay Sampling Technique", IEEE Journal of Solid-State Circuits, vol. 32, No. 18, Oct. 1997, 9 pages.
Kim, Se Jun et al., "A low-jitter wide-range skew-calibrated dual-loop DLL using antifuse circuitry for high-speed DRAM", IEEE Journal of Solid-State Circuits, vol. 37, Issue 6, Jun. 2002, 9 pages.
Kim, Beomsup et al., "PLL/DLL System Noise Analysis for Low Jitter Clock Synthesizer Design", Proceedings of IEEE International Symposium on Circuits and Systems—ISCAS '94, May 30-Jun. 2, 2004, 4 pages.
Kim, KwangSeok et al., "A 7 bit, 3.75 ps Resolution Two-Step Time-to-Digital Converter in 65 nm CMOS Using Pulse-Train Time Amplifier", IEEE Journal of Solid-State Circuits, vol. 48, No. 4, Apr. 2013, 9 pages.
Kwon, Hye-Jung et al., "An Open-Loop Differential Time Amplifier", IEEE International SoC Design Conference (ISOCC), Nov. 3-6, 2014, 2 pages.
Kwon, Hye-Jung et al., "Analysis of an Open-Loop Time Amplifier With a Time Gain Determined by the Ratio of Bias Current", IEEE Transactions on Circuits and Systems—II: Express Briefs, vol. 61, No. 7, Jul. 2014, 5 pages.
Lee, Hyun et al., "Design self-synchronized clock distribution networks in an SoC ASIC using DLL with remote clock feedback", Proceedings of 13th Annual IEEE International ASIC/SOC Conference (Cat. No. 00TH8541), Sep. 13-16, 2000, 5 pages.
Lim, Ji-Hoon et al., "A Delay Locked Loop with a Feedback Edge Combiner of Duty-Cycle Corrector with a 20%-80% Input Duty Cycle for SDRAMs", IEEE Transactions on Circuits and Systems—II: Express Briefs, vol. 63, No. 2, Feb. 2016, 141 pages.
Maneatis, John G., "Low-Jitter and Process-Independent DLL and PLL Based on Self-Biased Techniques", ISSCC96 I Session 8 / Digital Clocks and Latches I Paper FA 8.1, IEEE Journal of Solid-State Circuits, vol. 31, Issue 11, Nov. 1996, 3 pages.
Marzin, Giovanni et al., "A Spur Cancellation Technique for MDLL-based Frequency Synthesizers", 2013 IEEE International Symposium on Circuits and Systems (ISCAS), May 19-23, 2013, 4 pages.
Monaco, Enrico et al., "A 2-11 GHz 7-Bit High-Linearity Phase Rotator Based on Wideband Injection-Locking Multi-Phase Generation for High-Speed Serial Links in 28-nm CMOS FDSOI", IEEE Journal of Solid-State Circuits, vol. 52, No. 7, Jul. 2017, 14 pages.
Raman, Sangeeta et al., "A Precise Clock Phase Multiplier", IEEE International Symposium on Circuits and Systems, May 23-26, 2005, 4 pages.
Van De Beek, R.C.H., et al., "On Jitter Due to Delay Cell Mismatch in DLL-Based Clock Multipliers", IEEE International Symposium on Circuits and Systems (ISCAS 2002), IEEE Computer Society, May 2002, 4 pages.
Ziabakhsh, Sobeyl et al., "An All-Digital High-Resolution Programmable Time-Difference Amplifier Based on Time Latch", 2018 IEEE International Symposium on Circuits and Systems (ISCAS), May 27-30, 2018, 5 pages.

\* cited by examiner

SYSTEM AND METHOD FOR MEASURING DELAYS OF DELAY ELEMENTS

TECHNICAL FIELD

The present invention relates generally to a system and method for measuring delays of delay element.

BACKGROUND

Delay chain circuits are widely used in many electronic applications for various design purposes. For example, a delay chain circuit may be used in an open loop manner to implement a programmable delay line for use in matching delay paths on an integrated circuit, or may be used in a closed loop manner to implement a ring oscillator for use in a phase locked loop (PLL).

Delay chain circuits generally include a number of delay circuits connected in series. The delay provided by the delay chain can be made programmable if one or more of the individual delay circuits has an adjustable delay. The programmability of the individual delay elements, as well at the availability of the outputs of each individual delay circuit makes the delay chain circuit suitable for such applications as frequency multiplication, phase interpolation, and clock/data recovery. For example, in a frequency multiplication application, individual phase outputs of the delay chain circuit can be logically combined to provide an output clock frequency that is a multiple of the input clock frequency. In clock recovery applications, individual phase outputs can be selected based on an opportune sampling time (e.g., at a portion of the data "eye" that is most open).

However, practical effects such as layout matching, temperature drift and flicker noise may cause the delay of individual delay elements to deviate from each other. While feedback control using a circuit such as a DLL may be applied to the delay chain to keep the total delay of the delay chain constant, the delays of each individual delay element may be mismatched. This mismatch may degrade the accuracy of applications that relay on individual delay circuit outputs. For example, the phase accuracy of a delay chain-based phase interpolator and the duty cycle accuracy of a delay chain-based clock multiplier degrades with increased mismatch between delay elements of the delay chain.

SUMMARY

In accordance with an embodiment a circuit includes: a plurality of delay elements coupled in series, each delay element including an input node and an output node; a multiplexer having inputs coupled to the output node of each delay element of the plurality of delay elements; and a time measurement circuit including a time amplifier having an input coupled to an output of the multiplexer, and a counter coupled to an output of the time amplifier.

In accordance with another embodiment, a method, includes: selectively coupling an output of a first delay element to an input of a time measurement circuit; measuring a delay of the first delay element using the time measurement circuit; selectively coupling an output of a second delay element coupled in series with the first delay element to the input of the time measurement circuit; and measuring a delay of the second delay element using the time measurement circuit.

In accordance with a further embodiment, a circuit includes: a delay line including a plurality of tunable delay circuits coupled in series, each tunable delay circuit including a tunable delay element having a tuning input and a combining circuit configured to produce a pulse signal having a pulse-width proportional to a delay of the tunable delay element; a multiplexer having inputs coupled to outputs of the combining circuit of each tunable delay circuit of the plurality of tunable delay circuits; a time amplifier coupled to an output of the multiplexer; a counter coupled to an output of the time amplifier, the counter configured to produce time delay measurements by counting a time periods between adjacent edge transitions produced by the time amplifier; and a tuning circuit coupled between an output of the counter and the tuning input of tunable delay circuit of the plurality of tunable delay circuits.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, the delays of individual delay elements are equalized by measuring the delay of each delay element using the same time-to-digital converter. During operation, a reference measurement is made on a first delay element in the delay chain using the time-to-digital converter. The delays of the remaining delay elements are iteratively measured using the time-to-digital converter and modified until the individual delays match each other. In some embodiments, the time-to-digital converter includes a time amplifier, which is a circuit that essentially "amplifies"

a time delay. For example, when the time amplifier is presented with an input signal having at least two edges that are delayed with respect to each other by a first time delay, the time amplifier produces an output signal having at least two edges that are delayed with respect to each other by a second time delay greater than the first time delay. Because relative delay measurements are made using a single time-to-digital converter, a time-to-digital converter having a non-linear transfer characteristic can advantageously be used to achieve highly accurate delay matching.

Advantages of embodiments include the ability to achieve accurate delay matching in a delay chain without using high-resolution and complex analog-to-digital converters (ADCs) and time-to-digital converters (TDCs). Because a single time-to-digital converter is used, matching of relative measurements is maintained in the presence of process, voltage and temperature (PVT) variations, and layout mismatch variations. Advantageously, in some embodiments, the time-to-digital converter does not require calibration or an external clock. Moreover, high accurate delay matching can be achieved using a common power supply (e.g. VDD/VSS) domain.

Figure 1A:
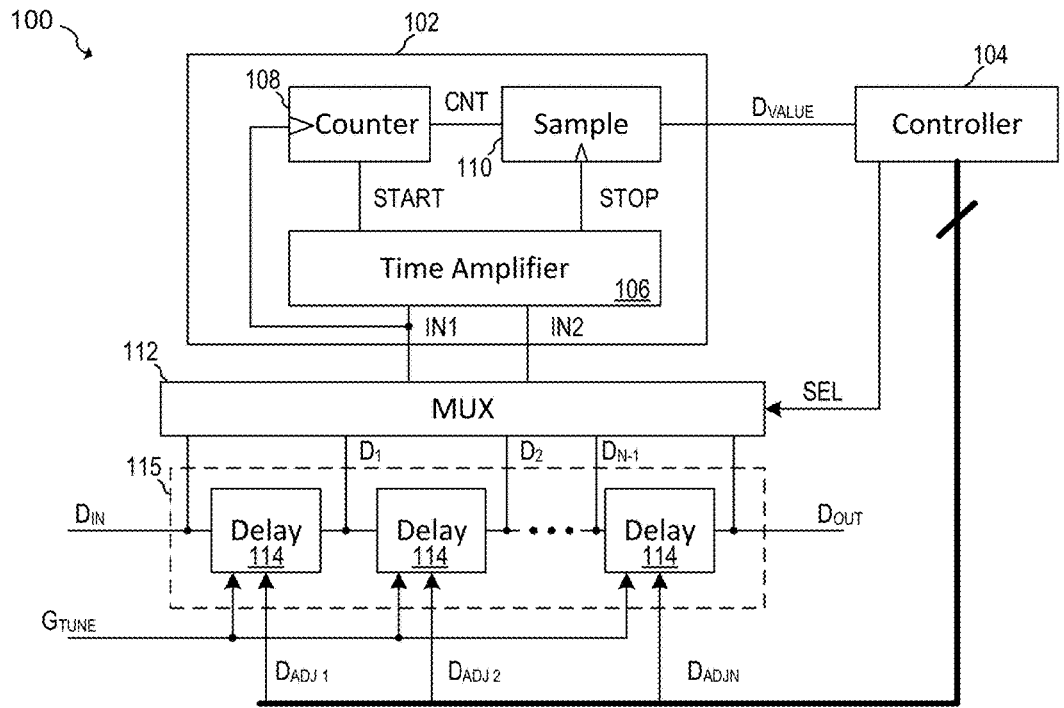
FIG. 1A illustrates a delay system according to an embodiment.

FIG. 1A illustrates a delay system 100 according to an embodiment of the present invention. Delay system 100 includes a delay line 115 that includes tunable delay elements 114 (also referred to as tunable delay circuits) coupled in series with each other. Accordingly, the aggregate delay between input $D_{IN}$ and output $D_{OUT}$ of delay line is the sum of the delays of each individual tunable delay element 114. As shown, the input and output nodes $D_{IN}$, $D_1$, $D_2$ .... $D_{N-1}$ and $D_{OUT}$ associated with each delay element 114 are connected to a time-to-digital converter 102 via multiplexer 112, which is configured to rout pairs of nodes from delay line 115 to inputs IN1 and IN2 of time-to-digital converter 102. In an embodiment, time-to-digital converter 102 is configured to measure a time delay between nodes IN1 and IN2 and provides a digital value $D_{VALUE}$ at a measurement output indicative of the measured time delay. Controller 104 (also referred to as a "tuning circuit") coupled to time-to-digital converter 102, multiplexer 112 and delay elements 114 of delay line 115 is configured to provide tuning values $D_{ADJ1}$, $D_{ADJ2}$ ... $D_{ADJN}$ to corresponding tunable delay elements 114 at respective delay control inputs.

Delay line 115 includes N tunable delay elements 114, where N is an integer of 2 or greater. In various embodiments each tunable delay element may be implemented using tunable delay element circuits known in the art. For example, tunable delay elements 114 may be implemented, for example, using current starved delay elements or one or more inverters loaded with a digitally selectable capacitance. Each tunable delay element 114 could also be implemented using a set of delay chains having a selectable number of delay stages. In some embodiments, each delay element may be constructed using a combination of one or more delay elements having a programmable delay and one or more delay elements having a non-programmable or static delay. Each delay element may provide an inverting or non-inverting output depending on the particular system and its specifications. Inverting stages may be useful, for example, in applications such as ring oscillators that rely on inverted signals to maintain a condition of oscillation.

Delay line 115 may be included in any system that utilizes delay lines, such as ring oscillator or time-to-digital converter for use in a PLL or other application, or a delay line for a DLL, a phase interpolator, a skew adjustment circuit, a digital-to-time converter, a pulse-width modulator, an out-phasing transmitter, or other circuit. Delay line 115 may include an odd or even number of delay stages depending on the particular application. In some embodiments each tunable delay element 114 may also be coupled to a global tuning signal $G_{TUNE}$ that tunes affects the delay of all delay elements simultaneously. Each tunable delay element 114 may combine global tuning signal $G_{TUNE}$ with a respective tuning value (e.g. $D_{ADJ1}$ to $D_{ADJN}$). In some embodiments, global tuning signal $G_{TUNE}$ may be a digital signal or an analog signal. In cases where global tuning signal $G_{TUNE}$ is a digital signal, the value of global tuning signal $G_{TUNE}$ may be summed with its respective tuning value (e.g. $D_{ADJ1}$ to $D_{ADJN}$) for each individual tunable delay element.

Time-to-digital converter 102 includes a time amplifier 106 having inputs IN1 and IN2 coupled to the output of a multiplexer 112, a counter 108, and a sampling circuit 110. Time amplifier 106 is configured to "amplify" a time delay of a signal provided at inputs IN1 and IN2 by an amplification factor. For example, for an amplification factor of 10, if a clock edge on input IN2 occurs 1 ns after a clock edge on input IN2, corresponding clock edges at output signals START and STOP will appear 10 ns apart from each other. Time amplifier 106 may be implemented using time amplifier circuits known in the art; however, an embodiment example will be described in further detail below with respect to FIGS. 2A and 2B. Counter 108 is configured to start counting using input IN1 as a clock signal when signal START is asserted, and sampling circuit no is configured to sample the output value CNT of counter 108 when signal STOP is asserted. In some embodiments, counter 108 is reset when signal STOP is asserted. The resulting delay measurement value $D_{VALUE}$ sampled by sampling circuit no represents the elapsed delay between the assertions of signals START and STOP in terms of the number of clock cycles present at input node IN. In alternative embodiments of the present invention, the clock input of counter 108 is coupled to separate clock reference different from the monitored signal at input IN1.

Counter 108 may be implemented using digital counter circuits known in the art including, but not limited to a binary counter, a ripple counter or a grey code counter. Sampling circuit no may be implemented, for example, using a register. In some embodiments, the functionality of counter 108 and sampling circuit no may be implemented using a single counter that is configured to start counting when signal START is asserted, and stop counting when signal STOP is asserted.

In various embodiments, controller 104 monitors the delay measurement value $D_{VALUE}$ and adjusts the tuning values $D_{ADJ1}$, $D_{ADJ2}$ ... $D_{ADJN}$ coupled to tuning inputs of the tunable delay elements 114 until the delays of tunable delay elements 114 match each other. Controller 104 may be used to measure a delay of a first tunable delay element as a reference delay value, and adjust the delays of the remaining delay elements until they match the reference delay value. In some embodiments, this process may involve using multiplexer 112 in conjunction with select signal SEL to rout the input and output of each individual tunable delay element to inputs IN1 and IN2 of time-to-digital converter 102, monitoring delay measurement value $D_{VALUE}$, and updating tuning values $D_{ADJ1}$, $D_{ADJ2}$ ... $D_{ADJN}$ of the tunable delay elements 114. In some embodiments, controller 104 updates tuning values $D_{ADJ1}$, $D_{ADJ2}$ ... $D_{ADJN}$ of the tunable delay elements 114 until delay measurement values $D_{VALUE}$ corresponding to each tunable delay element match each other or are within a predetermined range of each other. Adjustment of tuning values $D_{ADJ1}$, $D_{ADJ2}$ ... $D_{ADJN}$ may be performed at predetermined times (such as during power up) and/or may be performed continually in the background.

Figure 1B:
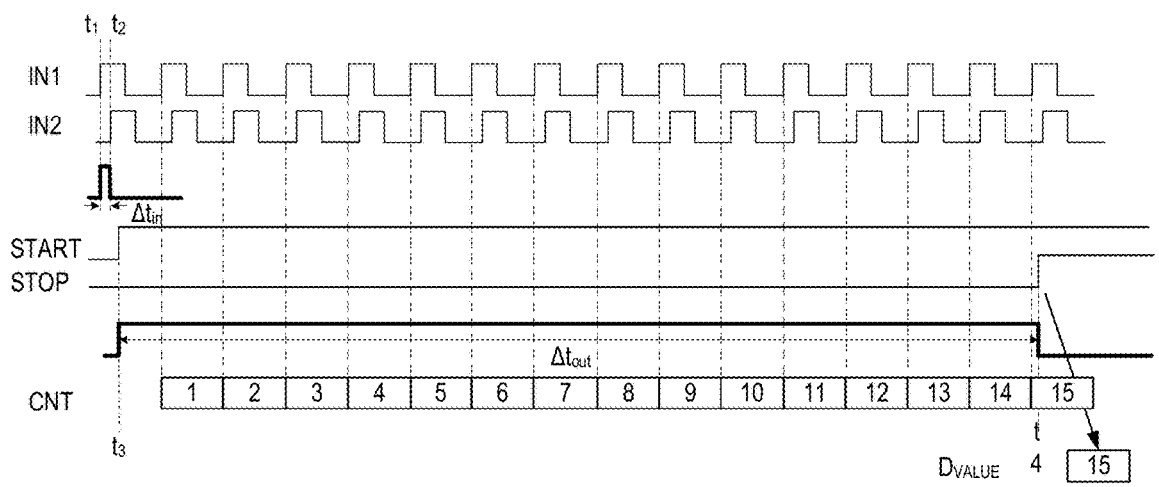
FIG. 1B illustrates a timing diagram of the delay system of FIG. 1A.

FIG. 1B shows a timing diagram that illustrates the operation of time-to-digital converter 102 of delay system boo. As shown, input signals IN1 and IN2 are delayed by a short time $\Delta t_{in}$ with respect to each other, and input signals START and STOP are delayed by a long time $\Delta t_{out}$ with respect to each other. More specifically, the signal IN1 has a rising edge at time $t_1$, which is followed by a rising edge on signal IN2 at time $t_2$. In response, signal START has a rising edge at time $t_3$, which is followed by a rising edge on signal STOP at time $t_4$. Output CNT of counter 108 begins incrementing at the second rising edge of signal $T_4$. The value of CNT (which in this case is 15) is transferred to sampling circuit 110 after time $t_4$ in response to the rising edge of signal STOP. The resulting value of CNT represents the number of clock cycles of signal IN1 between time $t_3$ when signal START is asserted and time $t_4$ when signal stop is asserted. In other words, the counter 108 is configured to produce time delay measurements by counting a time periods between adjacent edge transitions produced by time amplifier 106. This value of this time delay measurement is proportional to the time delay $\Delta t_{in}$ between input signals IN1 and IN2.

Figure 1C:
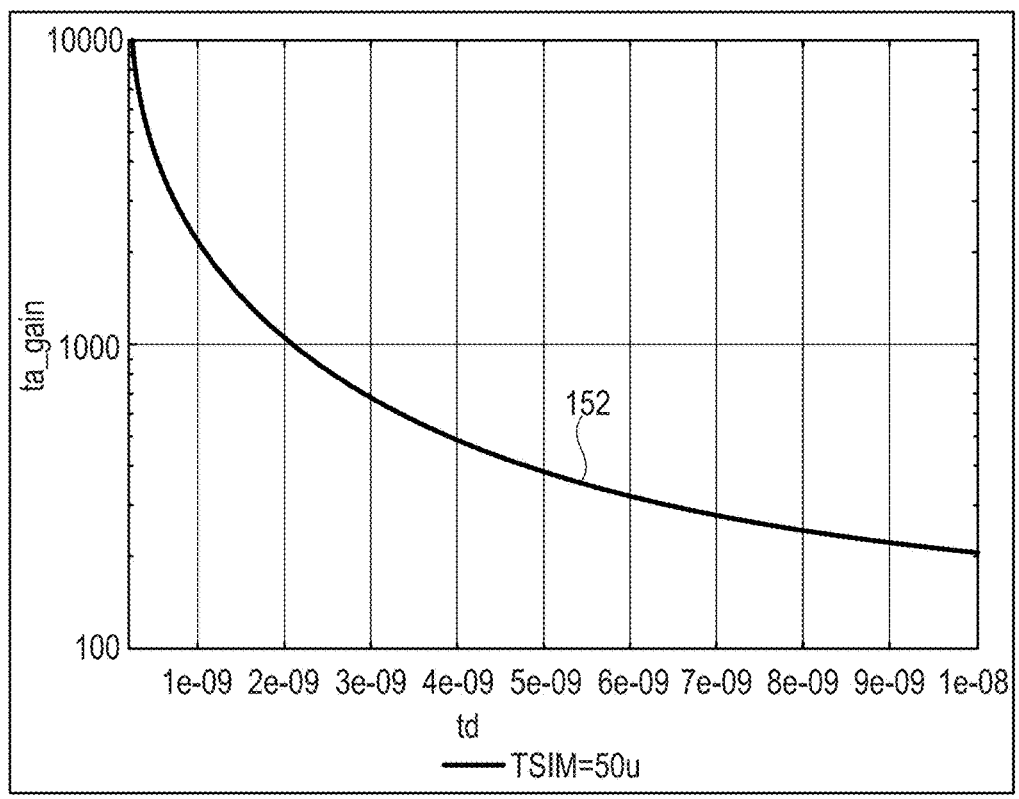
FIG. 1C illustrates a graph of gain with respect to input delay for an embodiment time amplifier.

One advantage of embodiments of the present invention is that that the delays of tunable delay elements 114 are equalized based on relative delay measurements and not absolute delay measurements. Because the same time-to-digital converter circuit is used for all delay measurements, these relative measurements will have high relative accuracy with respect to each other. Consequently, time amplifiers with a non-linear input output response, such as the response shown in FIG. 1C, can be used to achieve a high accuracy. FIG. 1C illustrates a graph of gain 152 with respect to input delay for a time amplifier according to an embodiment. It can be seen that the gain for small delays is higher than for long delays. For example, at an input delay of 1 ns, the gain is about 2000. Thus, for an input delay of about 1 ns, the time amplifier will produce an output delay of about 2000 ns. It should be understood that the graph depicted in FIG. 1C is just example of many possible time amplifier response functions, as the shape of the response curve will be dependent on the time amplifier circuit topology and the values of its circuit components. In alternative embodiments, time amplifiers with different response characteristics may be used.

Figure 1D:
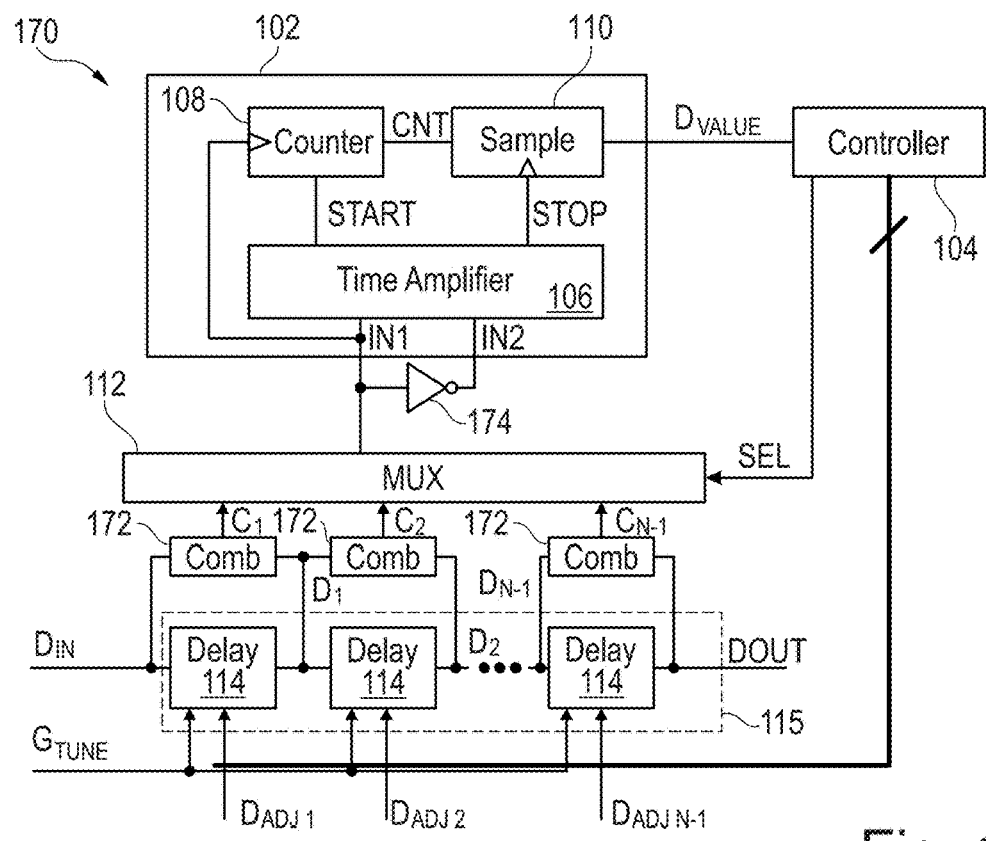
FIG. 1D illustrates a delay system according to another embodiment.

FIG. 1D illustrates delay system 170 according to a further embodiment of the present invention. Delay system 170 is similar to delay system 100 depicted in FIG. 1, with the exception that a combining circuit 172 is coupled between each delay element 114 and multiplexer 112. As shown, each combining network derives a combined signal $C_1, C_2 \ldots C_{N-1}$ for each delay element 114 that combine the input signal and the output signal of each delay element 114 into a single pulse signal having a pulse-width proportional to the delay of its respective delay element. In some embodiments, combining circuit 172 may be implemented using an exclusive OR (XOR) logic gate. In such embodiments, multiplexer 112 is configured to rout a single one of combined signals $C_1, C_2 \ldots C_{N-1}$ to signal IN1 at the input of time-to-digital converter 102. Signal IN2 may be derived using an inverter 174 as shown. In embodiments in which time amplifier 106 is configured to have a single input (e.g. the output delay is proportional to an input pulse width) inverter 174 may omitted. It should be further understood that any of the embodiments described herein may be adapted to include combining circuits 172 coupled to the outputs of respective tunable delay elements 114.

Figure 2A:
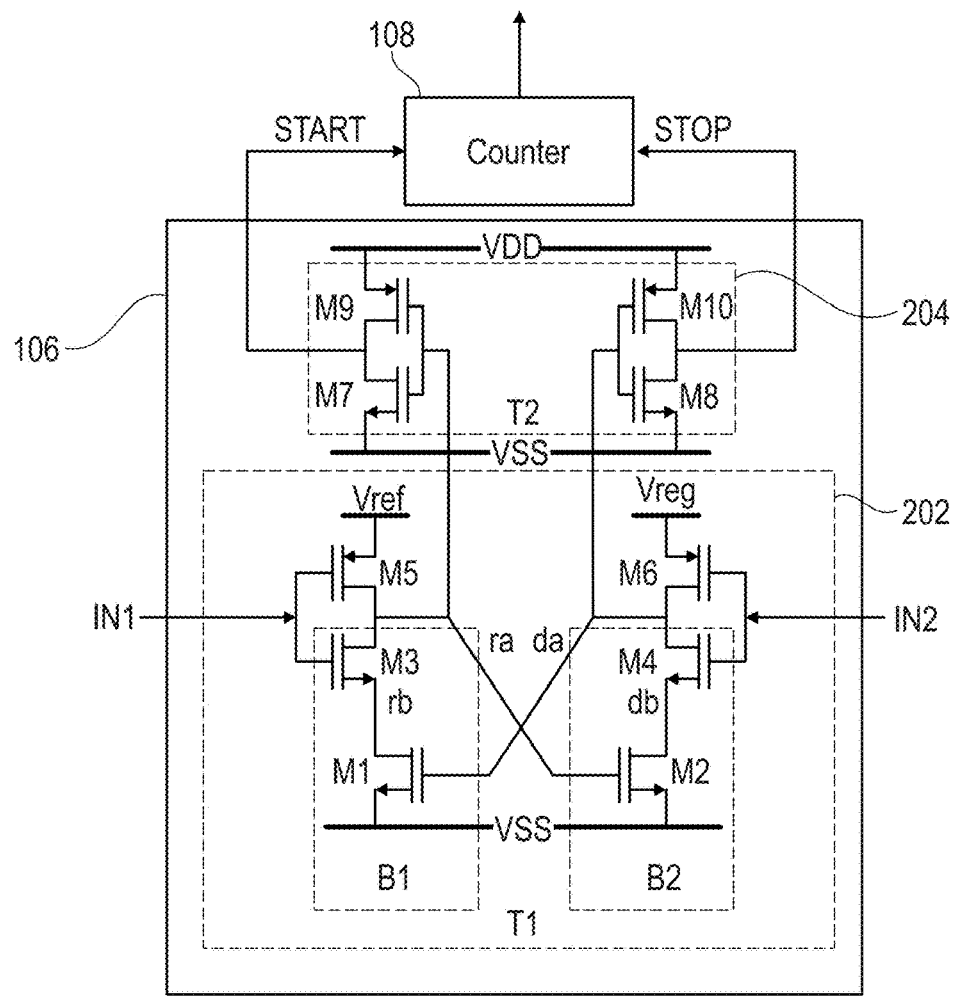
FIG. 2A illustrates a schematic of an embodiment time amplifier.

FIG. 2A illustrates an embodiment circuit implementation of time amplifier 106 coupled to counter 108. Time amplifier 106 includes an input stage 202 coupled to an output stage 204. Input stage 202 is configured as a cross-coupled latch circuit that includes a first inverter comprising PMOS transistor M5 and NMOS transistor M3 having gates coupled to input signal node IN1, and a second inverter comprising PMOS transistor M6 and NMOS transistor M4 coupled to input signal node IN2. Cross-coupled NMOS transistors M1 and M2 have drains respectively coupled to the sources of NMOS transistor M3 and M4 at nodes rb and db, and gates respectively coupled to the drains of NMOS transistors M4 and M3 at nodes da and ra. The output stage 204 includes a first inverter comprising PMOS transistor M9 and NMOS transistor M7 having gates coupled to node ra of input stage 202 and an output coupled to node START, and a second inverter comprising PMOS transistor M10 and NMOS transistor M8 having gates coupled to node da of input stage 202 and an output coupled node STOP.

Figure 2B:
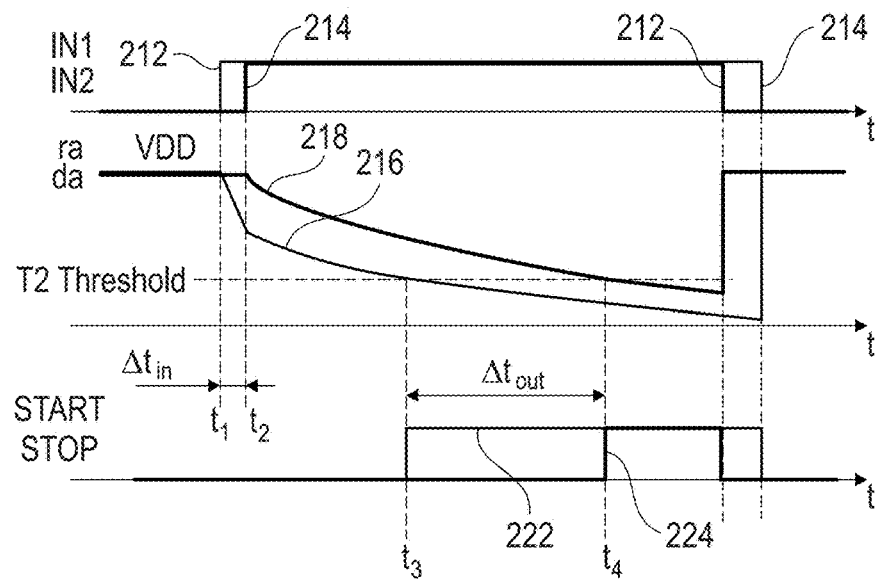
FIG. 2B illustrates a waveform diagram showing the operation of the time amplifier of FIG. 2A.

During operation, the gain of time amplifier 106 is provided by the slow response of the latch circuit while it is in a metastable state, as shown in the series of waveform diagrams shown in FIG. 2B. The top axis contains a plot of the voltage at nodes IN1 (trace 212) and IN2 (trace 214) with respect to time; the middle axis contains a plot of output nodes ra (trace 216) and da (trace 218) of input stage 202 with respect to time, and the bottom axis contains of plot of output nodes START (trace 222) and STOP (trace 224) of output stage 204.

As shown, when input signal IN1 (trace 212) is asserted at time $t_1$, the voltage at node ra (trace 216) decreases at a first rate. However, when input signal IN2 is asserted thereafter at time $t_2$, the voltage at node ra (trace 216) decreases at a slower rate, and the voltage at node da (trace 218) decreases at a slower rate as well. The slower discharge rate of nodes ra and da is due to the decreased voltage at these nodes, which decreases the conductivity of cross-coupled NMOS transistors M1 and M2.

When the voltage at node ra (trace 216) reaches threshold T2 (which is the threshold of the inverter of output stage 204 comprising NMOS transistor M7 and PMOS transistor M9), the voltage at output node START (trace 222) goes high at time $t_3$. At a later time, when node da (trace 218) reaches threshold T2 (which is the threshold of the inverter of output stage 204 comprising NMOS transistor M8 and PMOS transistor M10), the voltage at output node STOP (trace 224) also goes high at time $t_4$. However, because of the relatively slow response of input stage 202, the time difference between times $t_4$ and $t_3$ (e.g. $\Delta t_{out}$) is much greater than the time difference between times $t_2$ and $t_1$ (e.g. $\Delta t_{in}$), thus giving time amplifier 106 a gain.

It should be understood that the implementation of time amplifier 106 described above with respect to FIGS. 2A and 2B is one example of many possible time amplifier implementations. In alternative embodiments, other time amplifier structures could be used including time amplifier circuits known in the art. For example, in some embodiments, time amplifiers using combined delay elements, chains of delay elements, other configurations or combinations thereof may be used.

Figure 3A:
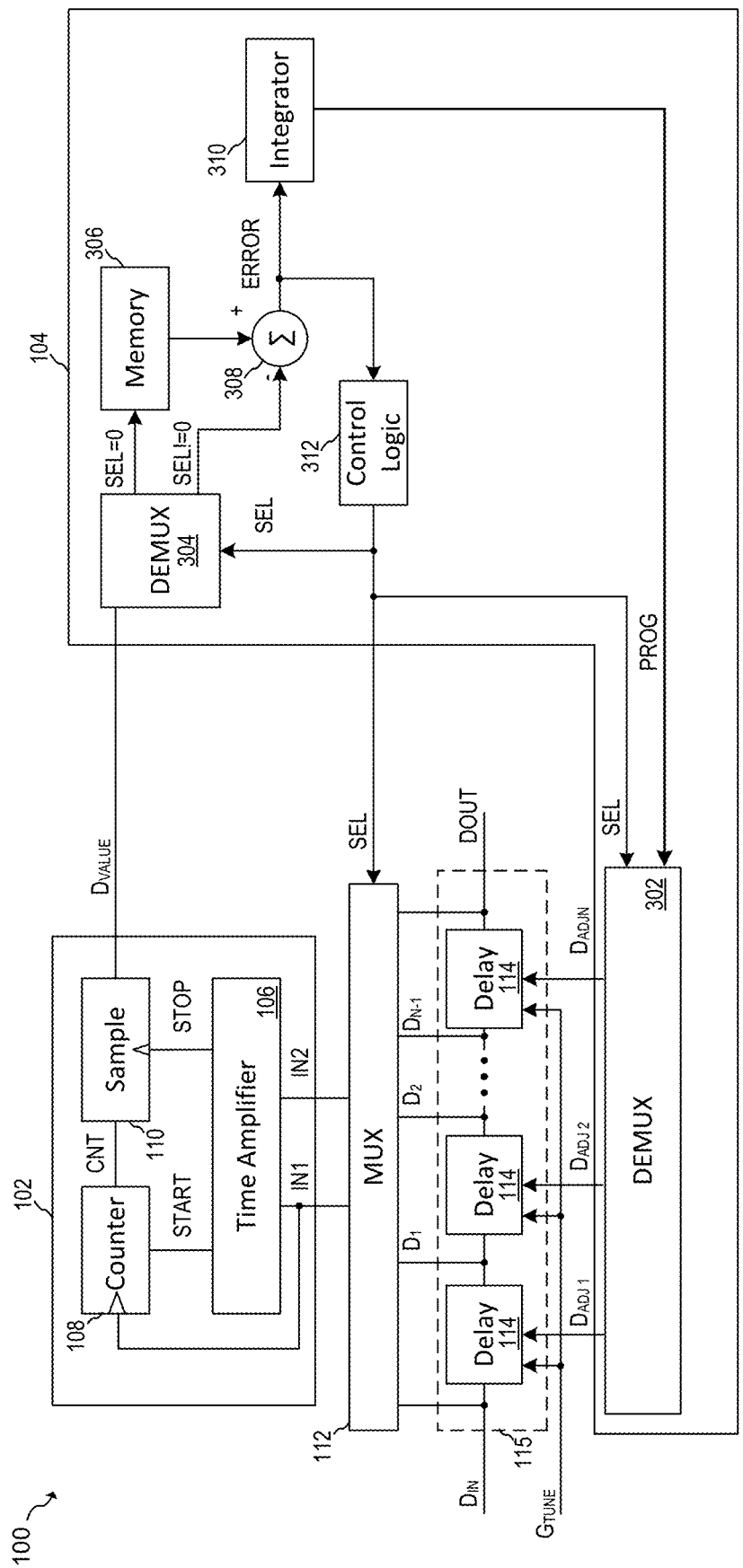
FIG. 3A illustrates a more detailed schematic of the delay system of FIG. 1A that provides further detail of a controller.

FIG. 3A illustrates delay system 100 which is the same as delay system 100 described above with respect to FIG. 1A, with the exception that the block representing controller 104 further includes a block diagram of a possible embodiment implementation. As shown, controller 104 includes demultiplexers 302 and 304, a memory 306, a summer 308 (also referred to as a "subtractor"), an integrator 310, control logic 312. In alternative embodiments, integrator 310 may be replaced by an another controller such as a proportional-integral (PI), proportional-integral-derivative (PID) controller, or another suitable controller structure known in the art that is configured to reduce error signal ERROR during operation. During operation, control logic increments selection signal SEL in order to successively each delay element 114 for a delay measurement via multiplexer 112 in accordance with the state machine described below with respect to FIG. 3B. Demultiplexer 304 routes measurement value $D_{VALUE}$ to either memory 306 or to summer 308. In the embodiment depicted in FIG. 3A, $D_{VALUE}$ is routed to memory 306 when SEL=0, which corresponds to the first tunable delay element 114 in delay line 115, to serve as a reference element. The value routed to memory 306 may be stored therein. It should be understood that the selection of SEL=0 for the reference element selection is used only for the purpose of illustration. In alternative embodiments, delay measurements of other delay elements 114 may be stored in memory 306 to serve as a reference measurement. In such cases, demultiplexer 304 may be used to route measurement value $D_{VALUE}$ to memory 306 for when selection signal SEL is another predetermined value besides zero.

For selection signal values besides zero, measurement value $D_{VALUE}$ is routed to the summer 308, which subtracts a present delay measurement value from the reference delay measurement value in memory 306 to form error signal ERROR. This error signal ERROR represents the difference in between the delay measurement value $D_{VALUE}$ for the presently selected delay element 114 and the measured delay value for the reference delay element 114. This error signal is integrated by integrator 310, which provides a programming value to the selected delay element 114 in order to set its delay value. In some embodiments, the programming value may be stored in separate registers for each corresponding tunable delay element 114 being programed. In some embodiments, summer 308 may be replaced with a comparator that is configured to compare the output of memory 306 with measured delay value.

During operation, control logic 312 iteratively causes memory 306 to store the delay measurement $D_{VALUE}$ corresponding to the reference delay element 114; successively obtains the measured delay values for each delay element 114; derives an error value ERROR for each delay element (representing the degree to which the delay of the presently selected delay element 114 matches the reference delay element 114; integrates the error value ERROR, and provides the integrated value to each selected delay element 114 as a delay programming value. These integrated values may be stored in separate registers (now shown) corresponding to each delay element 114.

In some embodiments, control logic 312 adjusts each selected delay element until the measured delay value $D_{VALUE}$ matches the measured reference delay stored in memory 306. Alternatively, the delay of each selected delay element 114 is adjusted until the measured delay is within a predetermined range of the reference delay stored in memory 306. In some embodiments, the delay of each selected delay element 114 is adjusted to minimize error value ERROR.

Figure 3B:
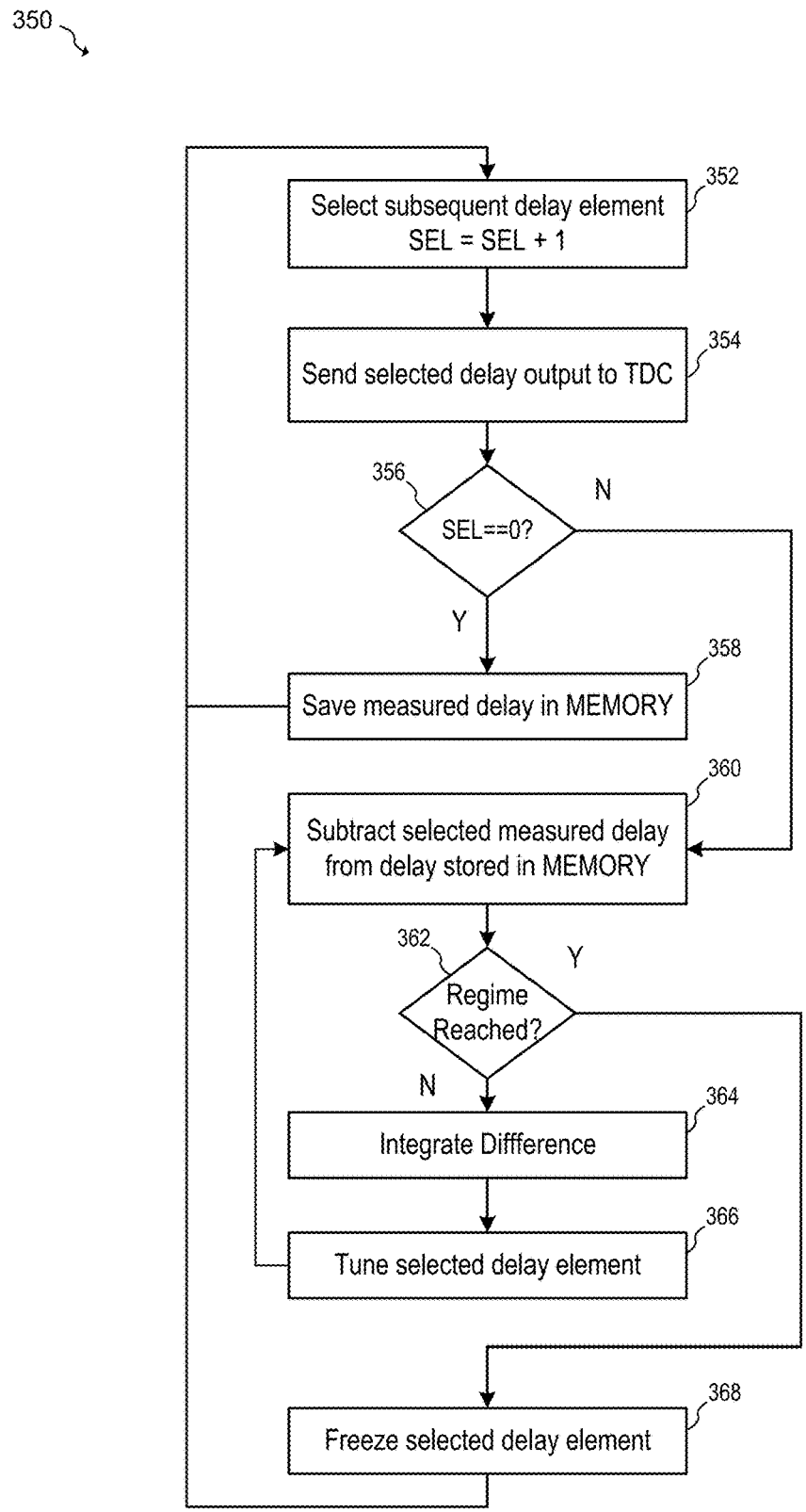
FIG. 3B illustrates a flow charge of a method of operating the delay system of FIG. 3A.

FIG. 3B illustrates a block diagram of method 350 that may be implemented by control logic 312 shown in FIG. 3A. During step 352, selection signal SEL is incremented, and in step 354, the selected delay output is sent to time-to-digital converter 102. Incrementing selection signal SEL effectively routs the outputs of the next tunable delay element 114 to the input of time-to-digital converter 102 via multiplexer 112, which allows the corresponding selected tunable delay element 114 to be measured by time-to-digital converter 102. In step 356 a determination is made whether or not the current value of SEL is equal to a reference value. In the block diagram of FIG. 3B, this reference value is zero. However, in alternative embodiments, a different reference value could be used. If the current value of SEL is equal to the reference value, the measured delay value $D_{VALUE}$ is stored in memory 306 in step 358. The method proceeds back to step 352 in order to increment select signal SEL to a further value after the reference delay has been stored in memory 306. On the other hand, if the current value of select signal SEL is not equal to the reference value, the method proceeds to step 360 in which the measured delay is subtracted from the reference delay stored in memory 306. In some embodiments, this subtraction is performed using summer 308 shown in FIG. 3A.

Next, in step 362, a determination is made whether or not a predetermined regime has been reached. In some embodiments, this determination may entail determining (1) whether or not the measured delay value is equal to the reference delay value (in which the subtracted value is zero), (2) determining whether or not the subtracted value is within a predetermined error range, or (3) determining whether the subtracted value represents a minimum error. If step 362 determines that the regime has been reached, the value PROG associated with the selected delay element is frozen in step 368. In some embodiment the value is frozen by storing the present value of PROG in a register. On the other hand, if the regime has not been reached, the difference calculated in step 360 is integrated, for example, using integrator 310. As mentioned above, integrator 310 may be replaced by another suitable controller structure, in which case step 360 would entail calculating the next output value of the implemented controller structure/algorithm. Next in step 366, the integrated difference is applied as a tuning signal to the selected delay element. In some embodiments, this is accomplished by applying integrator output PROG to the selected delay element 114 via demultiplexer 302 as shown in FIG. 3A. The method then proceeds back to step 360 in which case a new measurement of the selected delay cell is again subtracted from the reference delay stored in memory. Steps 360, 362, 364 and 366 are repeated until step 362 determines that the regime has been reached.

In some embodiments, method 350 is performed on a continuous basis in order to provide background calibration for delay line 115. Alternatively, method 350 may be run for each value of SEL a predetermined number of times and then halted, and then re-run on a periodic basis. For example, method 350 may be run at when delay system 100 is powered up, and then at predetermined time intervals. In some embodiments, method 350 is re-run based on environmental measurements. For example, the system may sense a condition that may affect the nominal delay values of delay elements 114, such as a change of temperature, and then re-run method 350 to ensure that the delays of delay element 114 remain matched.

Figure 4A:
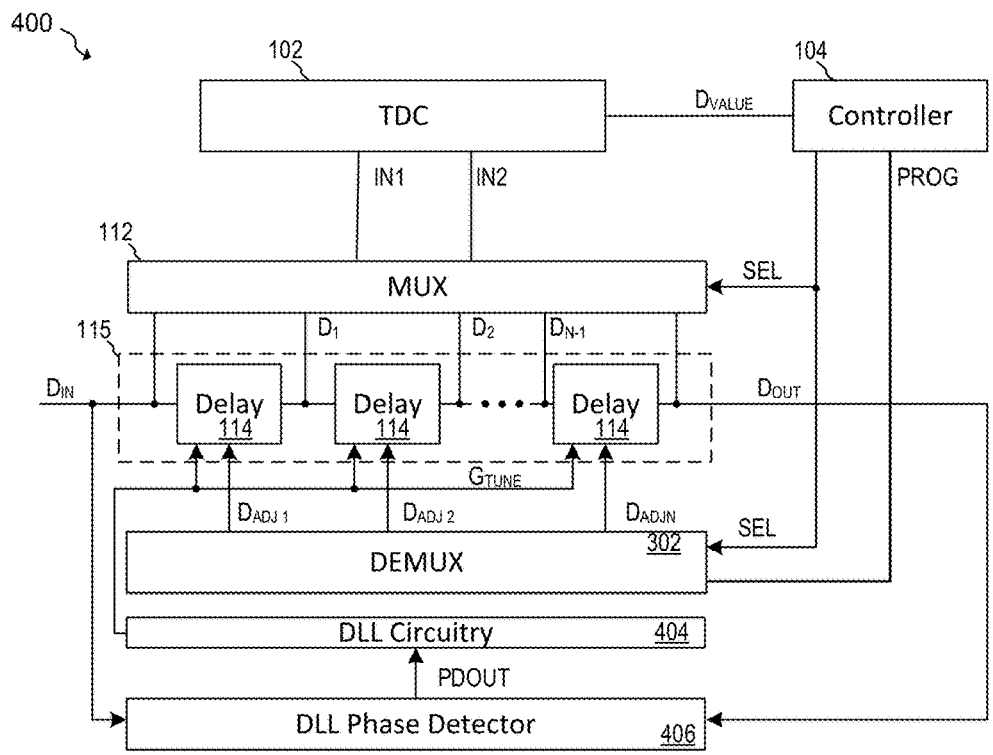
FIG. 4A illustrates a DLL system that utilizes an embodiment delay circuit.
Figure 4B:
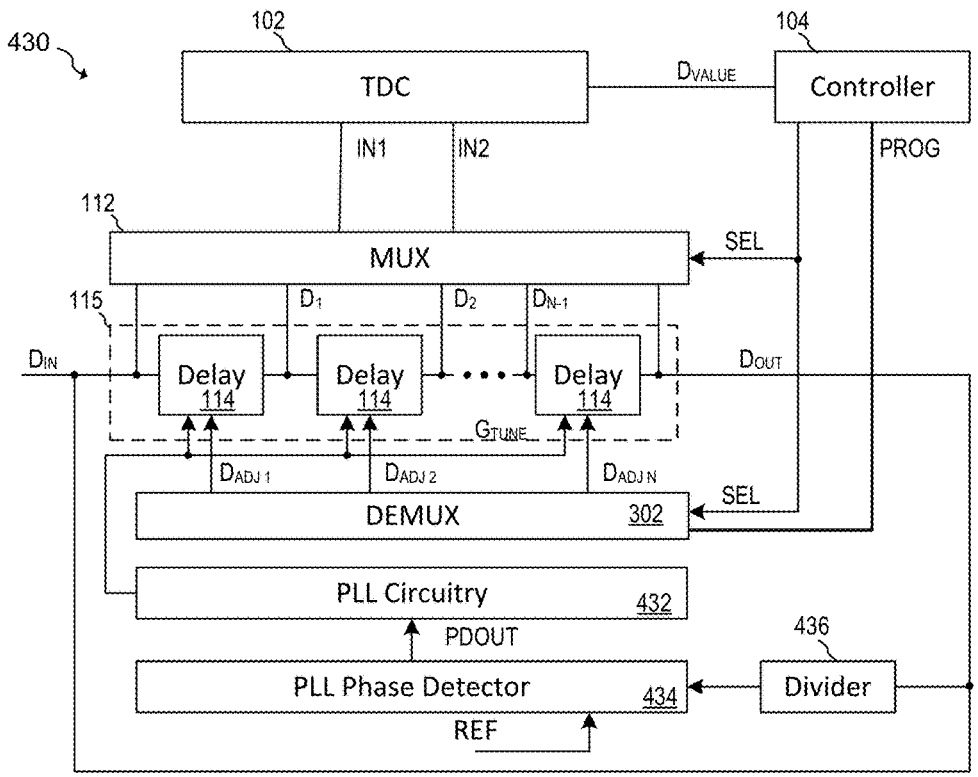
FIG. 4B illustrates a PLL that utilizes an embodiment delay circuit.

As mentioned above, embodiment delay systems can be used to implement a variety of systems. FIGS. 4A and 4B illustrate two such example systems. FIG. 4A illustrates an embodiment DLL and FIG. 4B illustrates and embodiment PLL.

FIG. 4A illustrates DLL system 400 according to an embodiment of the present invention. System 400 includes the components of delay system 100 described above with the addition of phase detector 406 and DLL digital circuitry 404. DLL phase detector may be implemented using phase detector (PD) or phase-frequency (PFD) detector circuits known in the art. As shown phase detector 406 is connected to input $D_{IN}$ of delay line 115 and to output $D_{OUT}$ of delay line 115, and is configured to provide a phase comparison signal PDOUT to DLL circuitry 404 indicative of the phase difference between input $D_{IN}$ and output $D_{OUT}$.

DLL circuitry 404 may include an analog loop filter and a charge pump for analog implementations, or may include a digital loop filter for digital implementations. In analog implementations, the output of DLL circuitry is an analog voltage that is used for global tuning signal $G_{TUNE}$. During operation, the loop gain of the DLL reduces the phase error represented by phase comparison signal PDOUT such that the phases of $D_{OUT}$ and $D_{IN}$ match each other. Under this condition, the total delay of delay line 115 is equal to a multiple of a clock cycle provided at input $D_1$.

FIG. 4B illustrates PLL system 430 according to an embodiment of the present invention. System 400 includes the components of delay system 100 described above with the addition of phase detector 434 and PLL circuitry 432, and divider 436. In addition, output $D_{OUT}$ is connected to input $D_{IN}$ such that delay line 115 forms a ring oscillator. Phase detector 434 may be implemented using phase detector (PD) or phase-frequency (PFD) detector circuits known in the art. Divider 436 may be implemented using a prescaler and divider circuits known in the art. In some embodiments, divider 436 may include a programmable divider and/or a programmable fractional divider. Phase detector 434 has phase detection input connected to the output of divider 436 and reference clock input REF, and is configured to provide a phase comparison signal PDOUT to PLL circuitry 432 indicative of the phase difference between the reference clock REF and the output of divider 436.

PLL circuitry 432 may include an analog loop filter and a charge pump for analog implementations, or may include a digital loop filter for digital implementations. In analog implementations, the output of PLL circuitry 432 is an analog voltage that is used for global tuning signal $G_{TUNE}$. During operation, the loop gain of the PLL reduces the phase error represented by phase comparison signal PDOUT such that the phases reference clock REF and the divided output of divider 436 match each other. Under this condition, the output frequency of a clock signal at $D_{OUT}$ is the frequency of the reference clock at node REF multiplied by the division ratio of divider 436. For example, if the frequency of reference clock REF is 10 MHz and the division ratio is 100, then the output frequency of the ring oscillator at node $D_{OUT}$ is 1 GHz.

It should be appreciated the configuration of DLL 400 shown in FIG. 4A and the configuration of PLL 430 shown in FIG. 4B are just specific examples of a DLL and PLL that could be implemented using embodiment delay lines. In alternative embodiments, other DLL or PLL structures could be implemented using embodiment delay lines. Moreover, embodiment delay lines could also be used to implement other circuits that utilize delay lines such as clock de-skewing circuits, phase interpolators, and the like.

Figure 5:
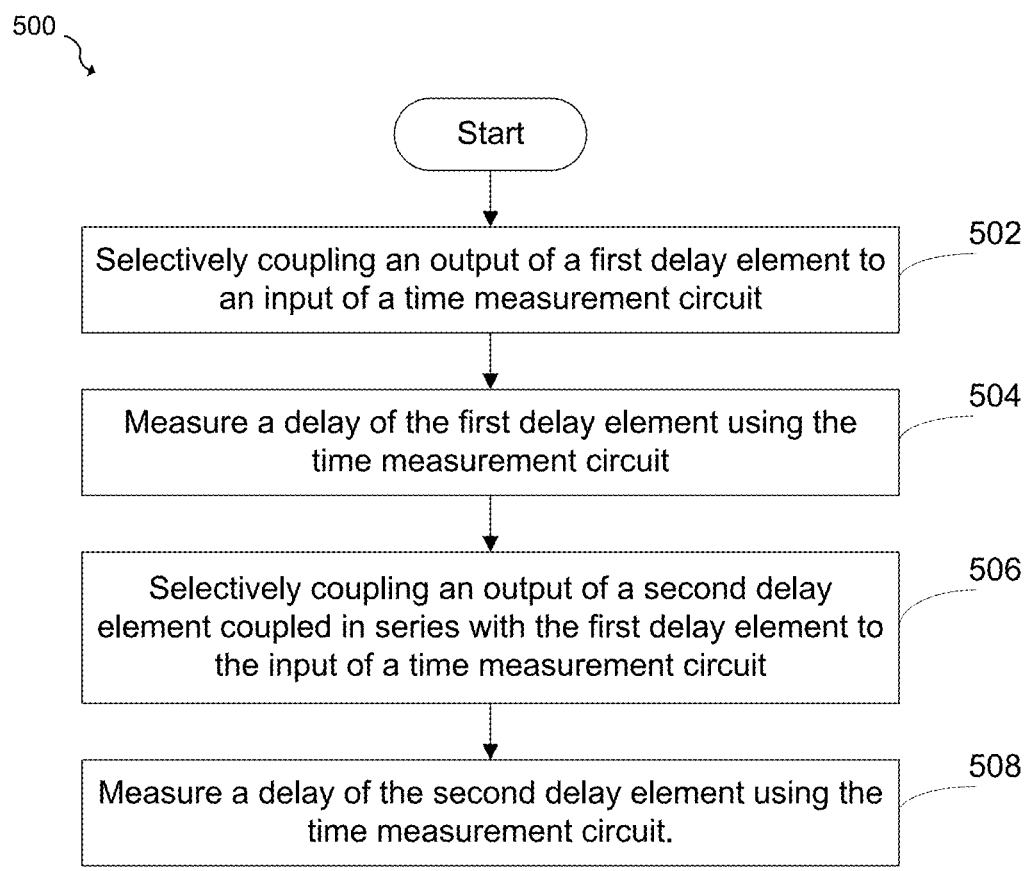
FIG. 5 illustrates a block diagram of a method according to an embodiment of the present invention.

FIG. 5 illustrates a block diagram of a method measuring a delay of a delay circuit that has a plurality of delay elements according to an embodiment of the present invention. In step 502, an output of a first delay element to an input of a time measurement circuit. In some embodiments the selective coupling may be achieved using a circuit, such as multiplexer 112 shown in Figures IA, 1D, 3A, 4A and 4B.

Moreover, in some embodiments, the input of the first delay element may also be coupled to the input of the time measurement circuit.

Next, in step 504, a delay of the first delay element is measured using the time measurement circuit. The time measurement circuit may be implemented using a time-to-digital converter as described above with respect to the embodiments of Figures IA, 1D, 3A, 4A and 4B.

In step 506, an output of a second delay element coupled in series with the first delay element is coupled to the input of the time measurement circuit. Again, the selective coupling may be achieved using a circuit, such as multiplexer 112 shown in Figures IA, 1D, 3A, 4A and 4B. Similar to step 502, in some embodiments, the input of the second delay element may also be coupled to the input of the time measurement circuit. In step 508, a delay of the second delay element is measured using the time measurement circuit.

Embodiments specifically described herein may be implemented using a complementary metal oxide semiconductor process (CMOS) that includes NMOS and PMOS devices. For example, a bipolar process could be used in which MOS transistors replaced by bipolar junction transistors (BJTs) and/or a BiCMOS process could be used in which some or all of the MOS transistors are replaced by bipolar junction transistors. In further embodiments, other processes may also be used.

Embodiments of the present invention are summarized here. Other embodiments can also be understood from the entirety of the specification and the claims filed herein.

Example 1. A circuit including: a plurality of delay elements coupled in series, each delay element including an input node and an output node; a multiplexer having inputs coupled to the output node of each delay element of the plurality of delay elements; and a time measurement circuit including a time amplifier having an input coupled to an output of the multiplexer, and a counter coupled to an output of the time amplifier.

Example 2. The circuit of example 1, where the time measurement circuit includes a cross-coupled latch circuit.

Example 3. The circuit of one of examples 1 or 2, where each delay element has a tunable delay and further includes a delay control input.

Example 4. The circuit of example 3, further including a tuning circuit coupled between the time measurement circuit and the delay control input of each delay element of the plurality of delay elements, the tuning circuit configured to: cause the multiplexer to couple the input node and the output node of a selected delay element of the plurality of delay elements to the input of the time amplifier; cause the time measurement circuit to measure a delay from the input node to the output node of the selected delay element; and adjust the tunable delay of the selected delay element based on the measured delay.

Example 5. The circuit of example 4, where the tuning circuit is further configured to: successively cause the multiplexer to couple the input node and the output node of each delay element of the plurality of delay elements to the input of the time amplifier; and successively cause the time measurement circuit to measure a delay from the input node to the output node of each delay element to obtain a delay measurement for each delay element.

Example 6. The circuit of one example 5, where the tuning circuit is further configured to successively adjust the delay of at least one delay element of the plurality of delay elements until the delay of the at least one delay element is within a predetermined range.

Example 7. The circuit of one of examples 5 to 6, where the tuning circuit is further configured to successively adjust the delay of at least one delay element of the plurality of delay elements until the delay of each delay element is substantially matched to each other.

Example 8. The circuit of one of examples 5 to 7, where the tuning circuit is further configured to successively adjust the delay of at least one delay element of the plurality of delay elements to match a measured delay of a reference delay element of the plurality of delay elements.

Example 9. The circuit of one of examples 5 to 8, where the tuning circuit further includes: a memory configured to store the measured delay of the reference element; a subtractor configured to determine a difference between the measured delay stored in the memory and a measurement of the delay of the at least one delay element; and an integrator coupled between an output of the subtractor and the delay control inputs of the plurality of delay elements.

Example 10. The circuit of one of examples 1 to 9, where each delay element includes a combining circuit having inputs coupled to its input node and its output node, and an output coupled to the input of the multiplexer.

Example 11. The circuit of one of examples 1 to 10, where each delay element includes a plurality of first delay elements.

Example 12. The circuit of one of examples 1 to 11, where the plurality of delay elements is arranged in a ring oscillator configuration.

Example 13. The circuit of one of examples 1 to 12, where the multiplexer further includes inputs coupled to the input node of each delay element.

Example 14. A method, including: selectively coupling an output of a first delay element to an input of a time measurement circuit; measuring a delay of the first delay element using the time measurement circuit; selectively coupling an output of a second delay element coupled in series with the first delay element to the input of the time measurement circuit; and measuring a delay of the second delay element using the time measurement circuit.

Example 15. The method of example 14, further including: selectively coupling an input of the first delay element to the input of the time measurement circuit; and selectively coupling an input of the second delay element to the input of the time measurement circuit.

Example 16. The method of one of examples 14 or 15, further including: combining the input and the output of the first delay element into a first combined signal before selectively coupling the input and the output of the first delay element to the input of the time measurement circuit; and combining the input and the output of the second delay element into a second combined signal before selectively coupling the input and the output of second first delay element to the input of the time measurement circuit.

Example 17. The method of one of examples 14 to 16, further including adjusting the delay of the second delay element based on the measured delay of the first delay element and the measured delay of the second delay element.

Example 18. The method of one of examples 14 to 17, further including storing the measured delay of the first delay element in a memory, and comparing the measured delay of the second delay element with the measured delay of the first element stored in memory before adjusting the delay of the second delay element.

Example 19. The method of one of examples 14 to 18, where measuring the delay of the first delay element using the time measurement circuit includes; amplifying a time delay between the input and the output of the first delay element using a time amplifier to form an amplified time delay; and measuring the amplified time delay using a counter.

Example 20. A circuit including: a delay line including a plurality of tunable delay circuits coupled in series, each tunable delay circuit including a tunable delay element having a tuning input and a combining circuit configured to produce a pulse signal having a pulse-width proportional to a delay of the tunable delay element; a multiplexer having inputs coupled to outputs of the combining circuit of each tunable delay circuit of the plurality of tunable delay circuits; a time amplifier coupled to an output of the multiplexer; a counter coupled to an output of the time amplifier, the counter configured to produce time delay measurements by counting a time periods between adjacent edge transitions produced by the time amplifier; and a tuning circuit coupled between an output of the counter and the tuning input of tunable delay circuit of the plurality of tunable delay circuits.

Example 21. The circuit of example 20, where the time amplifier includes a cross-coupled latch circuit.

Example 22. The circuit of one of examples 20 or 21, where the tuning circuit is configured to successively adjust delays of the plurality of tunable delay element based on the time delay measurements produced by the counter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a plurality of delay elements coupled in series, each delay element comprising an input node and an output node;
   a multiplexer having inputs coupled to the output node of each delay element of the plurality of delay elements; and
   a time measurement circuit comprising a time amplifier having an input coupled to an output of the multiplexer, and a counter coupled to an output of the time amplifier.

2. The circuit of claim 1, wherein the time measurement circuit comprises a cross-coupled latch circuit.

3. The circuit of claim 1, wherein each delay element has a tunable delay and further comprises a delay control input.

4. The circuit of claim 3, further comprising a tuning circuit coupled between the time measurement circuit and the delay control input of each delay element of the plurality of delay elements, the tuning circuit configured to:
   cause the multiplexer to couple the input node and the output node of a selected delay element of the plurality of delay elements to the input of the time amplifier;
   cause the time measurement circuit to measure a delay from the input node to the output node of the selected delay element; and
   adjust the tunable delay of the selected delay element based on the measured delay.

5. The circuit of claim 4, wherein the tuning circuit is further configured to:
   successively cause the multiplexer to couple the input node and the output node of each delay element of the plurality of delay elements to the input of the time amplifier; and successively cause the time measurement circuit to measure a delay from the input node to the output node of each delay element to obtain a delay measurement for each delay element.

6. The circuit of claim 5, wherein the tuning circuit is further configured to successively adjust the delay of at least one delay element of the plurality of delay elements until the delay of the at least one delay element is within a predetermined range.

7. The circuit of claim 5, wherein the tuning circuit is further configured to successively adjust the delay of at least one delay element of the plurality of delay elements until the delay of each delay element is substantially matched to each other.

8. The circuit of claim 5, wherein the tuning circuit is further configured to successively adjust the delay of at least one delay element of the plurality of delay elements to match a measured delay of a reference delay element of the plurality of delay elements.

9. The circuit of claim 8, wherein the tuning circuit further comprises:
a memory configured to store the measured delay of the reference element;
a subtractor configured to determine a difference between the measured delay stored in the memory and a measurement of the delay of the at least one delay element; and
an integrator coupled between an output of the subtractor and the delay control inputs of the plurality of delay elements.

10. The circuit of claim 1, wherein each delay element comprises a combining circuit having inputs coupled to its input node and its output node, and an output coupled to the input of the multiplexer.

11. The circuit of claim 1, wherein each delay element comprises a plurality of first delay elements.

12. The circuit of claim 1, wherein the plurality of delay elements is arranged in a ring oscillator configuration.

13. The circuit of claim 1, wherein the multiplexer further comprises inputs coupled to the input node of each delay element.

14. A method, comprising:
selectively coupling an output of a first delay element to an input of a time measurement circuit;
measuring a delay of the first delay element using the time measurement circuit;
selectively coupling an output of a second delay element coupled in series with the first delay element to the input of the time measurement circuit; and
measuring a delay of the second delay element using the time measurement circuit.

15. The method of claim 14, further comprising:
selectively coupling an input of the first delay element to the input of the time measurement circuit; and
selectively coupling an input of the second delay element to the input of the time measurement circuit.

16. The method of claim 15, further comprising:
combining the input and the output of the first delay element into a first combined signal before selectively coupling the input and the output of the first delay element to the input of the time measurement circuit; and
combining the input and the output of the second delay element into a second combined signal before selectively coupling the input and the output of second first delay element to the input of the time measurement circuit.

17. The method of claim 14, further comprising adjusting the delay of the second delay element based on the measured delay of the first delay element and the measured delay of the second delay element.

18. The method of claim 17, further comprising storing the measured delay of the first delay element in a memory, and comparing the measured delay of the second delay element with the measured delay of the first element stored in memory before adjusting the delay of the second delay element.

19. The method of claim 14, wherein measuring the delay of the first delay element using the time measurement circuit comprises;
amplifying a time delay between the input and the output of the first delay element using a time amplifier to form an amplified time delay; and
measuring the amplified time delay using a counter.

20. A circuit comprising:
a delay line comprising a plurality of tunable delay circuits coupled in series, each tunable delay circuit comprising a tunable delay element having a tuning input and a combining circuit configured to produce a pulse signal having a pulse-width proportional to a delay of the tunable delay element;
a multiplexer having inputs coupled to outputs of the combining circuit of each tunable delay circuit of the plurality of tunable delay circuits;
a time amplifier coupled to an output of the multiplexer;
a counter coupled to an output of the time amplifier, the counter configured to produce time delay measurements by counting a time periods between adjacent edge transitions produced by the time amplifier; and
a tuning circuit coupled between an output of the counter and the tuning input of tunable delay circuit of the plurality of tunable delay circuits.

21. The circuit of claim 20, wherein the time amplifier comprises a cross-coupled latch circuit.

22. The circuit of claim 20, wherein the tuning circuit is configured to successively adjust delays of the plurality of tunable delay elements based on the time delay measurements produced by the counter.

* * * * *